United States Patent [19]

Takaya

[11] Patent Number: 4,969,197

[45] Date of Patent: Nov. 6, 1990

[54] PIEZOELECTRIC SPEAKER

[75] Inventor: Tadashi Takaya, Kyoto, Japan

[73] Assignee: Murata Manufacturing

[21] Appl. No.: 312,999

[22] Filed: Feb. 21, 1989

[30] Foreign Application Priority Data

| | | | |
|---|---|---|---|
| Jun. 10, 1988 | [JP] | Japan | 63-143896 |
| Jun. 10, 1988 | [JP] | Japan | 63-143897 |
| Sep. 2, 1988 | [JP] | Japan | 63-220688 |

[51] Int. Cl.[5] ........................ H04R 17/00; H04R 7/04; H01L 41/09; H01L 41/18

[52] U.S. Cl. ........................ 381/190; 310/324; 310/345; 381/182; 381/186; 381/203

[58] Field of Search ............... 381/190, 152, 182, 184, 381/186, 203; 310/345, 324

[56] References Cited

U.S. PATENT DOCUMENTS

| | | | |
|---|---|---|---|
| 2,912,605 | 11/1959 | Tibbetts | 381/190 |
| 4,008,408 | 2/1977 | Kodama | 310/324 |
| 4,430,529 | 2/1984 | Nakagawa et al. | 381/190 |
| 4,597,099 | 6/1986 | Sawafuji | 381/190 |
| 4,820,952 | 4/1989 | Lee | 381/190 |

FOREIGN PATENT DOCUMENTS

| | | | |
|---|---|---|---|
| 3135096 | 9/1982 | Fed. Rep. of Germany | 310/324 |
| 61-264894 | 11/1986 | Japan | 381/190 |
| 63-16799 | 1/1988 | Japan | 381/190 |
| 64-2500 | 1/1989 | Japan | 381/190 |
| 1-24698 | 1/1989 | Japan | 381/190 |
| 1-44699 | 2/1989 | Japan | 381/190 |

*Primary Examiner*—Jin F. Ng
*Assistant Examiner*—Danita R. Byrd

[57] ABSTRACT

A piezoelectric speaker in which a diaphragm containing a piezoelectric driver is fixed on a frame through an elastic supporting member. The diaphragm is an assembly of two resin foam plates facing each other. Each resin foam plate has a recess and a projecting member at the substantial center of the recess bottom. The piezoelectric driver is accommodated in the space made of the two recesses while being interposed and supported by the projecting members at the substantial center thereof.

21 Claims, 6 Drawing Sheets

PIEZOELECTRIC SPEAKER

BACKGROUND OF THE INVENTION (1) Field of the Invention

This invention refers to a piezoelectric speaker which generates sound by vibrating a diaphragm using one or more piezoelectric driver(s).

(2) Description of the Prior Art

As shown in FIG. 1, a conventional piezoelectric speaker 1 of this type has a piezoelectric driver 3 integrally molded in a resin foam plate 2. 4 is a lead.

In the above piezoelectric speaker 1, the vibration of the piezoelectric driver 3 is restricted by the resin foam plate 2 in the vicinity thereof. Accordingly, the piezoelectric speaker 1 has low efficiency as a sounding body, resulting in a low sound pressure level.

SUMMARY OF THE INVENTION

The subject invention has an object of offering a piezoelectric speaker having a high sound pressure level by solving the above problem.

Another object of this invention is to offer a piezoelectric speaker having an improved frequency characteristic.

The above objects are fulfilled by a piezoelectric speaker which generates sound by vibrating a diaphragm using a piezoelectric driver, comprising a piezoelectric driver that is vibrated in bending mode by piezoelectric effect; a diaphragm, formed by assembling two opposed plane resin foam plates, each having a recess, wherein the pair of recesses make a space, which is to accommodate the piezoelectric driver and which is essentially bigger than the piezoelectric driver; a piezoelectric driver supporting means for supporting the substantial center of the piezoelectric driver accommodated in the above space; and a frame for supporting the diaphragm without restricting its vibration.

The above objects may also be fulfilled by a piezoelectric speaker which generates sound by vibrating a diaphragm using multiple piezoelectric drivers, comprising multiple piezoelectric drivers that are vibrated in bending mode by piezoelectric effect; a diaphragm, formed by assembling two opposed plane resin foam plates, each having multiple recesses, wherein the pairs of recesses make spaces, which are to respectively accommodate the multiple piezoelectric drivers and which are essentially bigger than their respective piezoelectric drivers; piezoelectric driver supporting means for supporting the substantial centers of piezoelectric drivers respectively accommodated in the above spaces; and a frame for supporting the diaphragm without restricting its vibration.

The two resin foam plates forming the diaphragm may have different sizes, and a margin of the bigger resin foam plate extending out over the smaller resin foam plate may be fixed on the frame through an elastic supporting member. The piezoelectric driver supporting means may be a projecting member provided on the recess bottom of one of the resin foam plates.

The piezoelectric driver supporting means may be two opposed projecting members, which are respectively provided on the recess bottoms of the two resin foam plates and which interpose and support the piezoelectric driver when the two resin foam plates are assembled.

The projecting member may be integrally formed on the resin foam plate.

The projecting members may be integrally formed on their respective resin foam plates.

Each of the two resin foam plate may have a uniform density.

Each of the two resin foam plates may have a higher density at the thin portion neighboring the recess than at the remaining thick portion.

Resin sheets may be pasted on the whole main outer surfaces of the two resin foam plates.

The two resin foam plates forming the diaphragm are vibrated by driving the piezoelectric driver, whereby sound is emitted from both main surfaces of the diaphragm.

A thin poster may be pasted on the whole main outer surface of the resin foam plate.

According to this invention, the piezoelectric driver is contained in the space of the diaphragm without being contacted with anything except its portions which are supported by the piezoelectric driver supporting means. Consequently, the resin foam plates do not restrict the vibration of the piezoelectric driver, which provides the piezoelectric speaker with improved efficiency as a sounding body and accordingly with a high sound pressure level.

If the two resin foam plates forming the diaphragm have different sizes, and if the margin of the bigger resin foam plate extending out over the smaller resin foam plate is fixed on the frame through the elastic supporting member, the diaphragm can mostly fill up the space surrounded by the inner wall of the frame. As a result, the surface of the diaphragm is enlarged, which provides the piezoelectric speaker with a high sound pressure level.

If each of the two resin foam plates has a higher density at the thin portion neighboring the recess than at the remaining thick portion, the thin portion is strong and rigid enough to convey the vibration of the piezoelectric driver to the whole resin foam plate. This construction maintains the sound pressure level - frequency curve flat, so as to improve the frequency characteristic. When the thin portion is too weak and flexible to convey the vibration of the piezoelectric driver to the whole resin foam plate, the diaphragm is locally vibrated and the sound pressure level - frequency curve greatly fluctuates. Such a problem is solved by the above construction with the densified thin portion.

If resin sheets are pasted on the whole main outer surfaces of the two resin foam plates, the rigidity of the resin foam plates are heightened. As a result, the sound pressure level - frequency curve is kept flat to improve the frequency characteristic. Another advantage of the above construction is that the outer surfaces of the resin foam plates are too hard to scratch when the piezoelectric speaker is packed. Still another advantage of the above construction is that the outer surfaces of the resin foam plates are too highly solvent resistant to deteriorate when they are degreased using an organic solvent. Still another advantage of the above construction is that the surfaces of the resin foam plates are smoothed to improve the appearance.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

Figure 1:
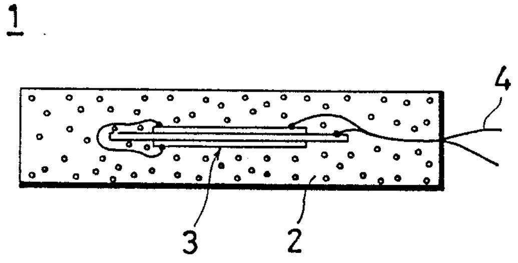
Fig. 1 Prior Art
FIG. 1 is a cross sectional view of a conventional piezoelectric speaker.
Figure 2:
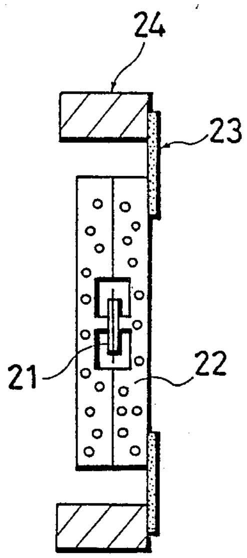
FIG. 2 a cross sectional view of an embodiment of the present invention.
Figure 3:
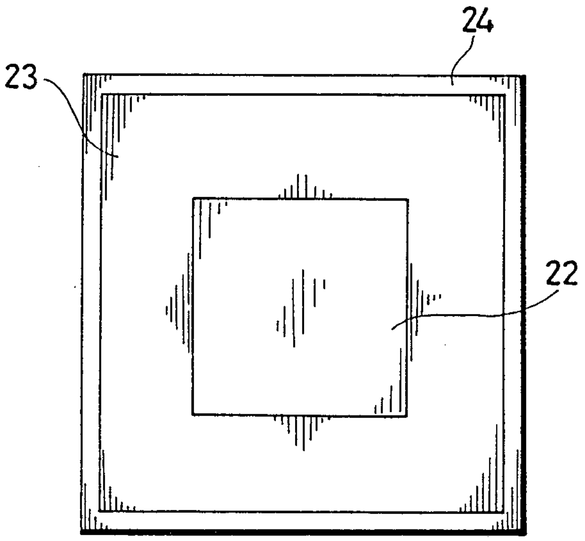
FIG. 3 is a front view of the same.

FIG. 2 shows a cross section of an embodiment of the present invention. A diaphragm 22 containing a piezoelectric driver 21 is surrounded by a frame 24, and the gap therebetween is bridged over by an edge 23, which is pasted on the front-surface margin of the diaphragm 22. The edge 23 is a square plate having a smaller square cutout at the center thereof as shown in FIG. 3 and is formed of such an elastic material as urethane foam, rubber or leather.

Figure 4:
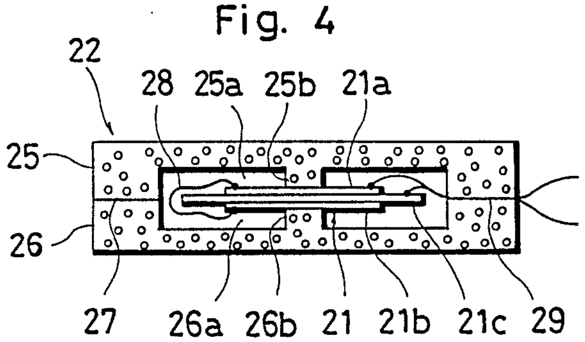
FIG. 4 is a detailed cross sectional view of a diaphragm and a piezoelectric driver of the same.

As shown in FIG. 4, the piezoelectric driver 21 is of the bimorph type, which has two piezoelectric plates 21*a* and 21*b*, made of PZT or the like, interposing a metal plate 21*c*. When electric signals are applied to both piezoelectric plates 21*a* and 21*b*, the whole piezoelectric driver 21 including the metal plate 21*c* is vibrated in bending mode by piezoelectric effect.

The piezoelectric driver 21 may also be of the unimorph type.

The diaphragm 22 is produced by assembling two opposed resin foam plates 25 and 26, each of which has a recess 25*a* or 26*a* and a projecting member 25*b* or 26*b*. The recesses 25*a* and 26*a* make a space somewhat bigger than the piezoelectric driver 21 when the two resin foam plates 25 and 26 are assembled, and the projecting members 25*b* and 26*b* are integrally formed at the substantial centers of the bottoms of the recesses 25*a* and 26*a*, respectively. The piezoelectric driver 21 is accommodated in a space made of the recesses 25*a* and 26*a* while being interposed and supported by the projecting members 25*b* and 26*b*.

For the resin foam plates 25 and 26, polystylene foam, polyethylene foam, a copolymer of the two, or the like may be employed.

The projecting members 25*b* and 26*b* are cylindrical in this embodiment and are adhered on the piezoelectric driver 21. They may have another shape, for instance, a cone.

The resin foam plates 25 and 26 may be adhered with each other at their contacting plane 27 to seal the inner space, or they may be just contacted.

In the above-described construction, the piezoelectric driver 21 is contained in the space of the diaphragm 22 without being contacted with anything except its portions supported by the projecting members 25*b* and 26*b*. Therefore, its vibration is not restricted by the resin foam plates 25 and 26. In consequence, this piezoelectric speaker has improved efficiency as a sounding body and accordingly has a high sound pressure level.

When the two resin foam plates 25 and 26 are vibrated back and forth (up and down in FIG. 4), the compression of the air in its vicinity is fluctuated to emit sound. Therefore, the sound is emitted from both main surfaces of the diaphragm 22. In other words, this piezoelectric speaker is a bidirectional plane speaker.

Moreover, the piezoelectric driver 21, which is interposed by the projection members 25*b* and 26*b*, is stably supported and so highly impact resistant.

In FIG. 4, a lead 28 connects the piezoelectric plates 21*a* and 21*b*, and another lead 29 connects the piezoelectric plate 21*a* and the metal plate 21*c*.

Figure 5:
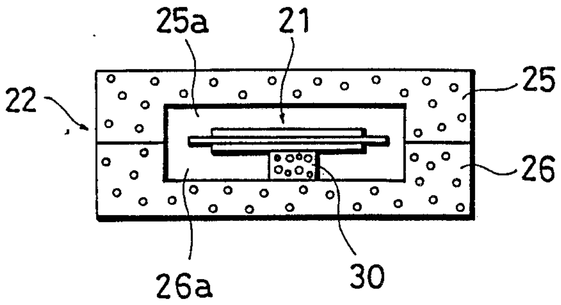
FIG. 5 is a detailed cross sectional view of another diaphragm which is applicable to the present invention.

FIG. 5 shows a cross section of another diaphragm applicable to this invention. This diaphragm is different from the one of FIG. 4 in that the piezoelectric driver 21 is supported only by one projecting member 30 and that the projecting member 30 is independent from the resin foam plate 26. The projecting member 30 is bonded on the piezoelectric driver 21 and on the resin foam plate 26 with an adhesive, and is formed of a rigid and light material such as resin foam.

The projecting member 30 may be integrally formed on the resin foam plate 26 though it is not shown here. The projecting members 25*b* and 26*b* om FIG. 4 may be independent from the resin foam plates 25 and 26 though it is not shown here, either.

Figure 6:
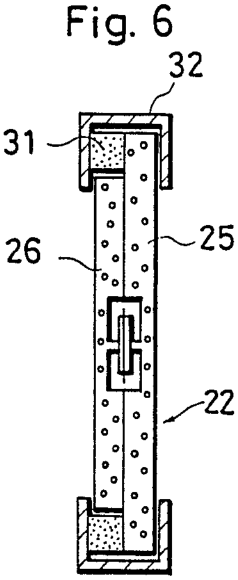
FIG. 6 is a cross sectional view of another embodiment of the present invention.

FIG. 6 shows still another embodiment of this invention. The diaphragm 22 comprises a bigger resin foam plate 25 and a smaller resin foam plate 26. The margin of the bigger resin foam plate 25 which is extended out over the smaller resin foam plate 26 is fixed on a frame 32 through an elastic supporting member 31.

The frame 32 is made of such metal as aluminum, and has a squared gutter all along its inner wall. The margin of the bigger resin foam plate 25 and the elastic supporting member 31 are inserted into this gutter.

The elastic supporting member 31 is a long, narrow tape made of such resin foam as urethane foam or polyethylene foam or of rubber foam, and is stuck on the inner wall of the frame without any opening, using a kind of both-sided adhesive tape. The elastic supporting member 31 is bonded with the bigger resin foam plate 25 using an appropriate amount of adhesive, and supports the diaphragm 22 in the manner that its vibration may not be restricted.

Figure 7:
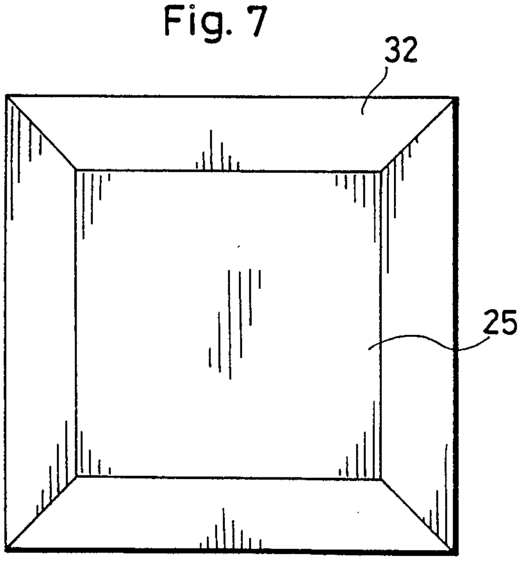
FIG. 7 is a front view of the same.

FIG. 7 is a front view of this embodiment, i.e. a view seen from the right of FIG. 6. The front view includes only the frame 32 and the bigger resin foam plate 25, realizing a neat appearance.

Figure 8:
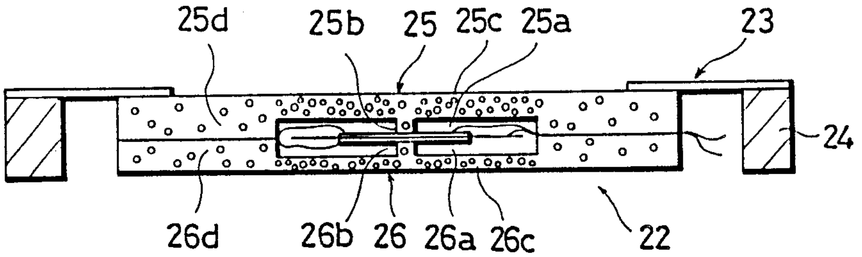
FIG. 8 is a cross sectional view of still another embodiment of the present invention, FIGS. 9(*a*) and 9(*b*) show how to produce the resin foam plates which are employed in the same.

FIG. 8 shows still another embodiment of this invention. In the embodiments so far described, the resin foam plates 25 and 26 have a uniform density. In this embodiment, on the other hand, thin portions 25*c* and 26*c* neighboring the space have a higher density than the other portions 25*d* and 26*d*, which makes the thin portions 25*c* and 26*c* more rigid and stronger. As a result, the diaphragm 22 is not locally vibrated, and the sound pressure level-frequency curve is kept flat in the low frequency range, whereby an excellent frequency characteristic is obtained.

Figure 9A:
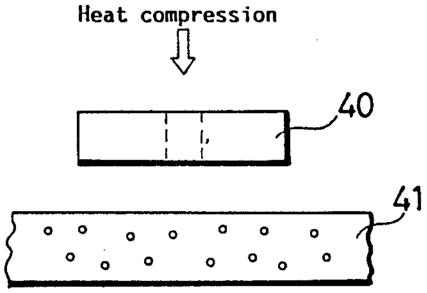
Figure 9B:
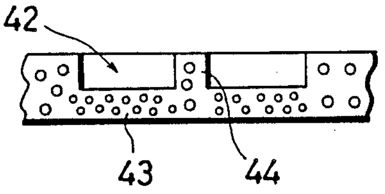

A preferable method of densifying the thin portions 25*c* and 26*c* is, as shown in FIG. 9(*a*), to heat-compress a resin foam plate 41 of a uniform thickness, using a hot press punch 40. FIG. 9(b) is a cross sectional view of a resin foam plate after the press punch 40 is pulled out. 42 corresponds to the recess 25*a* (or 26*a*) of FIG. 8, 43 to the thin portion 25*c* (or 26*c*), and 44 to the projecting member 25*b* (or 26*b*).

The two resin foam plates are of the same size in FIG. 8, but, needless to say, the resin foam plates may have different sizes as in FIG. 6.

Figure 10:
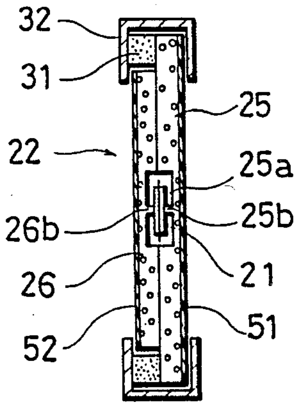
FIG. 10 is a cross sectional view of still another embodiment of the present invention.

FIG. 10 shows still another embodiment of this invention. Resin sheets 51 and 52 made of polyethylene terephthalate (PET), vinyl chloride or the like are respectively pasted on the whole main outer surfaces of the resin foam plates 25 and 26 in order to rigidify these plates and thus to improve the frequency characteristic. First, an adhesive is pasted on the resin sheets 51 and 52, and then these resin sheets 51 and 52 are pasted on the main outer surfaces of the resin foam plates 25 and 26. In this way, the diaphragm 22 gets smooth surfaces though the resin foam plates 51 and 52 have rough surfaces. The resin sheets 51 and 52 preferably have a thickness of approx. 25 $\mu$m to 100 $\mu$m in order to prevent the sound pressure level - frequency curve from greatly fluctuating and to improve the frequency characteristic.

Figure 11A:
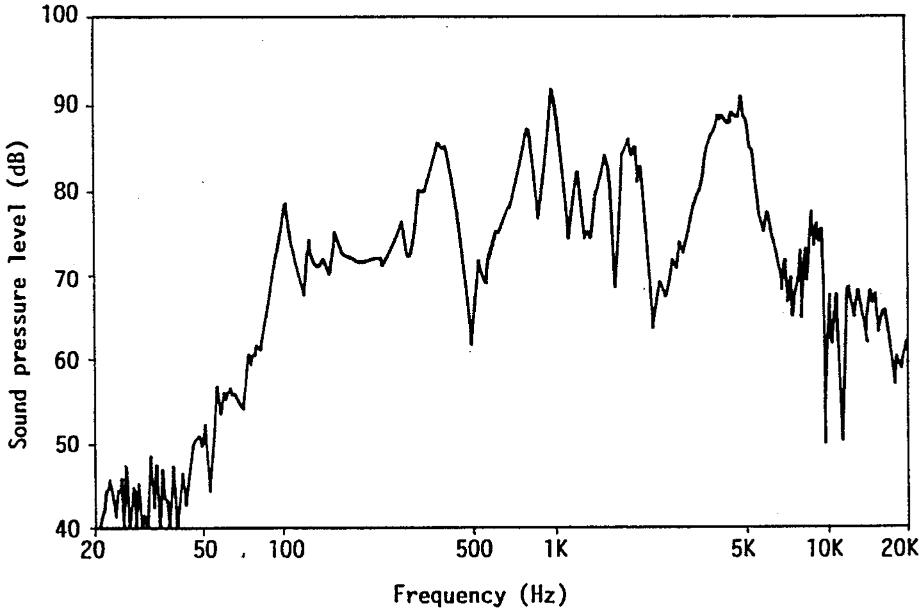
FIGS. 11(a) shows the frequency characteristic of the same, FIG. 11(*b*) shows the frequency characteristic of another piezoelectric speaker which has the same construction as the above except that it has no resin sheets.
Figure 11B:
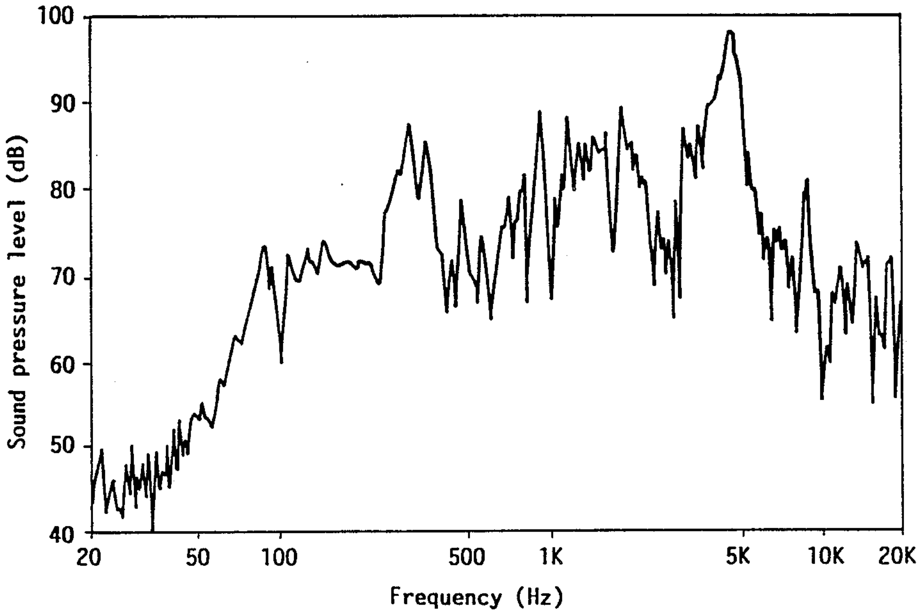

FIG. 11(*a*) and 11(*b*) respectively show the frequency characteristics of the speakers with and without the resin sheets 51 and 52. The speaker with the resin sheets 51 and 52 generates less fluctuations of the sound pressure level - frequency curve in the middle and high frequency range than the speaker without them. It means the resin sheets 51 and 52 improves the frequency characteristic in this frequency range.

The diaphragm 22 is formed of the resin from plates of different sizes in FIG. 10, but, needless to say, the resin sheets 51 and 52 may be pasted on the diaphragm formed of the resin foam plates having the same size shown in FIG. 2.

Figure 12:
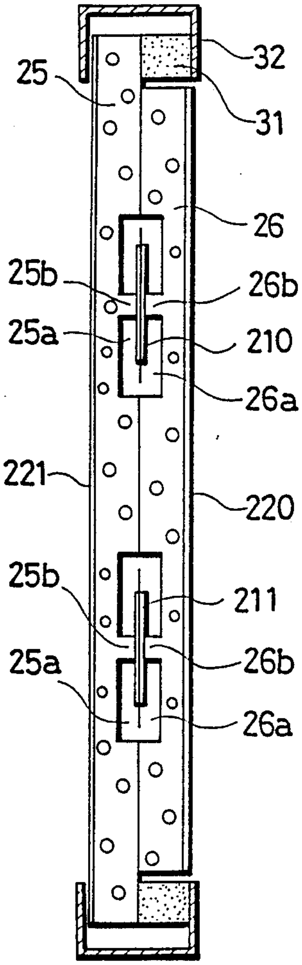
FIG. 12 is a cross sectional view of still another embodiment of the present invention.
Figure 13:
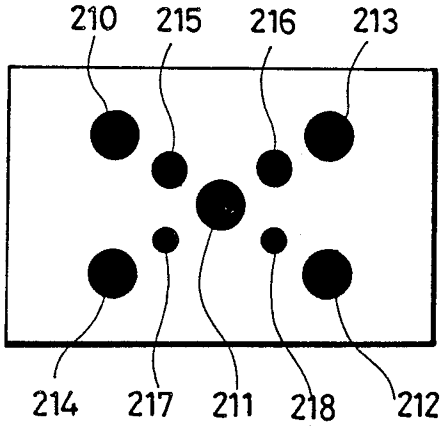
FIG. 13 shows the arrangement of the piezoelectric drivers in the same, FIG. 14(*a*) is a front perspective view of still another embodiment of the present invention, and FIG. 14(*b*) is a rear perspective view of the same.

FIG. 12 shows still another embodiment of this invention. In the embodiments so far described, one piezoelectric driver is contained in the diaphragm. This embodiment, however, has multiple piezoelectric drivers 210, 211, . . . . Both of the resin foam plates 25 and 26 have multiple recesses 25 a and 26*a* to make multiple spaces, each of which accommodates a piezoelectric driver. The piezoelectric drivers may be provided in any number and at any position as far as they do not have any adverse effect on the sound pressure level and the frequency characteristic. In this embodiment, nine piezoelectric drivers are provided in an X shape as shown in FIG. 13. The piezoelectric drivers 210 to 218 may have the same diameter, or different diameters as in FIG. 13. The embodiment of FIG. 12 employes the resin sheets 220 and 221 to rigidify the resin foam plates 25 and 26 and thus to improve the frequency characteristic. Also can be employed is the construction shown in FIG. 8, whereby the thin portions of the resin foam plates 25 and 26 are densified. The projecting members 25*b* and 26*b* may be independent from the resin foam plates 25 and 26 as in FIG. 5. Also as in FIG. 5, only one projecting member may be provided on a recess bottom.

Figure 14A:
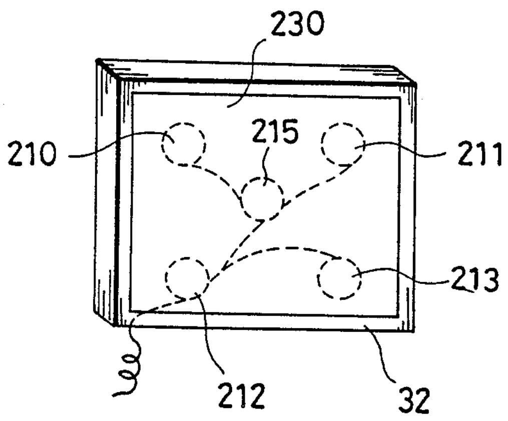
Figure 14B:
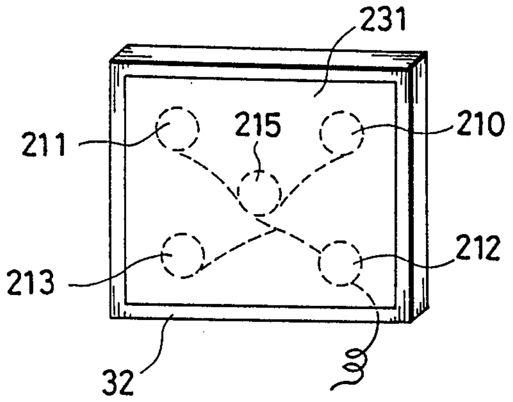

FIG. 14(*a*) and 14(*b*) show still another embodiment of this invention. Poster 230 and 231 are respectively pasted on the parts of the outer surfaces, which can be seen from outside, of the resin foam plates 25 and 26 to realize a fashionable appearance.

The posters 230 and 231 are preferably made of thin paper or synthetic resin film. The posters may be replaced by sheets with various pictures, etc.

In this way, a compact, light, thin and fashionable bidirectional plane speaker is realized. It goes well with interior decorations and can be used as a talking billboard.

Although the present invention has been fully described by way of embodiments with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A piezoelectric speaker which generates sound by vibrating a diaphragm using a piezoelectric driver, comprising:
   - a piezoelectric driver that is vibrated in bending mode by piezoelectric effect,
   - a diaphragm, formed by assembling two opposed plane resin foam plates, each having a recess, wherein the pair of recesses make a space, which is to accommodate said piezoelectric driver and which is bigger than said piezoelectric driver,
   - a piezoelectric driver supporting means for supporting the substantial center of said piezoelectric accommodated in the above space, and
   - a frame for supporting said diaphragm without restricting its vibration.

2. A piezoelectric speaker claimed in claim 1, wherein the two resin foam plates forming said diaphragm have different sizes and wherein a margin of the bigger resin foam plate extending out over the smaller resin foam plate is fixed on said frame through a elastic supporting member.

3. A piezoelectric speaker claimed in claim 1, wherein said piezoelectric driver supporting means is a projecting member provided on the recess bottom of one of the resin foam plates.

4. A piezoelectric speaker claimed in claim 1, wherein said piezoelectric driver supporting means are two opposed projecting members, which are respectively provided on the recess bottoms of the two resin foam plates and which interpose and support said piezoelectric driver when the two resin foam plates are assembled.

5. A piezoelectric speaker claimed in claim 3, wherein the projecting member is integrally formed on the resin foam plate.

6. A piezoelectric speaker claimed in claim 4, wherein the projecting members are integrally formed on their respective resin foam plates.

7. A piezoelectric speaker claimed in claim 1, wherein each resin foam plate has a uniform density.

8. A piezoelectric speaker claimed in claim 1, wherein each resin plate has a higher density at the thin portion neighboring the recess than at the remaining thick portion.

9. A piezoelectric speaker claimed in claim 1, wherein resin sheets are pasted on the whole main outer surfaces of the resin foam plates.

10. A piezoelectric speaker claimed in claim 1, wherein the two resin foam plates forming said diaphragm are vibrated by driving said piezoelectric driver, whereby sound is emitted from both main surfaces of said diaphragm.

11. A piezoelectric speaker claimed in claim 1, wherein a thin poster is pasted on the main outer surface of the resin foam plate.

12. A piezoelectric speaker which generates sound by vibrating a diaphragm using multiple piezoelectric drivers, comprising:

multiple piezoelectric drivers that are vibrated in bending mode by piezoelectric effect, a diaphragm, formed by assembling two opposed plane resin foam plates, each having multiple recesses, wherein the pairs of recesses make spaces, which are to respectively accommodate said multiple piezoelectric drivers and which are bigger than their respective piezoelectric drivers, piezoelectric driver supporting means for supporting the substantial centers of said piezoelectric drivers respectively accommodated in the above spaces, and a frame for supporting said diaphragm without restricting its vibration.

13. A piezoelectric speaker claimed in claim 12, wherein said piezoelectric driver supporting means is a projecting member provided on the recess bottom of one of the resin foam plates.

14. A piezoelectric speaker claimed in claim 12, wherein said piezoelectric driver supporting means are two opposed projecting members, which are respectively provided on the recess bottoms of the two resin foam plates and which interpose and support said piezoelectric driver when the two resin foam plates are assembled.

15. A piezoelectric speaker claimed in claim 13, wherein each projecting member is integrally formed on the resin foam plate.

16. A piezoelectric speaker claimed in claim 14, wherein the projecting members are integrally formed on their respective resin foam plates.

17. A piezoelectric speaker claimed in claim 12, wherein each resin foam plate has a uniform density.

18. A piezoelectric speaker claimed in claim 12, wherein each resin foam plate has a higher density at the thin portion neighboring the recess than at the remaining thick portion.

19. A piezoelectric speaker claimed in claim 12, wherein resin sheets are pasted on the whole main outer surfaces of the resin foam plates.

20. A piezoelectric speaker claimed in claim 12, wherein the two resin foam plates forming said diaphragm are vibrated by driving said piezoelectric drivers, whereby sound is emitted from both main surfaces of said diaphragm.

21. A piezoelectric speaker claimed in claim 20, wherein a thin poster is pasted on the main outer surface of the resin foam plate.

* * * * *